(12) United States Patent
Jiang

(10) Patent No.: US 9,997,335 B2
(45) Date of Patent: Jun. 12, 2018

(54) PLASMA SOURCE ENHANCED WITH BOOSTER CHAMBER AND LOW COST PLASMA STRENGTH SENSOR

(71) Applicant: Ximan Jiang, San Mateo, CA (US)

(72) Inventor: Ximan Jiang, San Mateo, CA (US)

(*) Notice: Subject to any disclaimer, the term of this patent is extended or adjusted under 35 U.S.C. 154(b) by 0 days. days.

(21) Appl. No.: 15/596,937

(22) Filed: May 16, 2017

(65) Prior Publication Data

US 2017/0294290 A1    Oct. 12, 2017

Related U.S. Application Data

(62) Division of application No. 15/092,625, filed on Apr. 7, 2016, now Pat. No. 9,691,592.

(60) Provisional application No. 62/146,273, filed on Apr. 11, 2015.

(51) Int. Cl.
*H01J 37/00* (2006.01)
*H01J 37/32* (2006.01)

(52) U.S. Cl.
CPC ...... *H01J 37/32357* (2013.01); *H01J 37/321* (2013.01); *H01J 37/32192* (2013.01); *H01J 37/32623* (2013.01); *H01J 37/32935* (2013.01); *H01J 2237/08* (2013.01)

(58) Field of Classification Search
CPC ......... H01L 2924/0002; H01L 2924/00; H01L 29/7869; H01L 21/3065; H01L 29/66969; H01L 21/02554; H01L 21/02565; H01L 21/31138; H01L 21/67069; H01L 27/1225; H01L 21/0223; H01L 21/31116; H01L 21/32136

See application file for complete search history.

(56) References Cited

U.S. PATENT DOCUMENTS

2015/0364315 A1* 12/2015 Ramsey ............... H01J 49/24
250/282

* cited by examiner

*Primary Examiner* — Monica C King
(74) *Attorney, Agent, or Firm* — Jigang Jin

(57) ABSTRACT

A method to improve plasma discharge efficiency by attaching one or more booster chambers to the main discharge chamber is disclosed here. The booster chamber functions as a plasma discharge amplification device for the main discharge chamber. It improves plasma density significantly, especially at pressure below 50 mTorr. Compared with traditional inductively coupled plasma (ICP) source, the strength of the plasma source enhanced with booster chamber has been improved several folds at low pressure conditions. Booster chamber can also be used as a convenient high speed plasma etching and deposition processing chamber for small samples. A method to gauge plasma strength by measuring plasma emission intensity has also been disclosed in this application.

8 Claims, 8 Drawing Sheets

PLASMA SOURCE ENHANCED WITH BOOSTER CHAMBER AND LOW COST PLASMA STRENGTH SENSOR

CROSS REFERENCE TO RELATED APPLICATIONS

The present application is a divisional application of U.S. patent application Ser. No. 15/092,625, which claims priority to U.S. Provisional Application No. 6214627, filed on Apr. 11, 2015, both of which are incorporated herein by reference in their entireties.

FIELD OF INVENTION

This invention relates to the field of plasma source design for ion, electron beam production, downstream plasma cleaning, etching and deposition.

BACKGROUND

High efficiency low pressure plasma source has been widely used in neutron generator, downstream plasma cleaner, molecular beam epitaxy (MBE), ion and electron beam production. In many applications, the remote plasma sources are attached to a downstream vacuum chamber. The pressure inside the downstream vacuum chamber should be kept as low as possible. For example, the downstream vacuum chamber pressure for plasma ion source assembly should be kept below $10^{-4}$ torr to avoid the risk of arcing. In downstream plasma cleaning or deposition applications, reactive radicals generated in the plasma source diffuse into the downstream sample chamber to carry out etching or deposition process on the sample surface. If the pressure in the downstream sample chamber is too high, radicals may recombine and loose reactivity in the downstream sample chamber. An obvious and well-known solution is to use a differential pumping aperture between the plasma source and the downstream sample chamber. Plasma sources equipped with differential pumping aperture or flow restrictor have been disclosed in many prior arts, such as U.S. Pat. Nos. 3,961,103, 5,788,778 and 6,749,717. However, flow restrictor can also limit the transportation of the radical species into the processing chamber, as pointed out by U.S. Pat. No. 4,088,926.

Plasma ion sources also use an aperture plate for differential pumping and beam shaping purpose, such as the design published in Review of Scientific Instruments V74, 2288(2003). To obtain a broader ion or electron beam, a beam shaping aperture with wider openings will be required. However, wider opening on the aperture plate will greatly reduce the pressure difference between the plasma source and the downstream vacuum chamber. High pressure inside the downstream vacuum chamber can significantly increase the risk of arcing between high voltage electrodes. The plasma source design disclosed here improved the performance of traditional ICP plasma ion sources at low pressure conditions. It increased the plasma strength by 2 to 3 times compared with traditional ICP plasma sources under similar conditions. It can ignite and sustain a plasma with only 0.1 mTorr pressure inside the plasma source if air is used as the process gas. The improved performance is achieved by adding an extra booster tube to the traditional ICP plasma chamber.

The booster tube in this application has some similar properties as the traditional hollow cathode or hollow anode electrode. But there is no cathode or anode electrode in inductively coupled plasma source or microwave plasma source. The booster chamber design disclosed in this invention is an attachment to the discharge chamber of fully functionally plasma sources. Yet it greatly improves the plasma density at low pressure through a positive feedback mechanism. Traditional hollow cathode or hollow anode is usually designed to be part of an electrode that usually has a bias voltage, such as U.S. Pat. Nos. 4,871,918, 4,954,751 and 6,452,315. In traditional hollow cathode or hollow anode plasma source, high rf or DC voltages are applied to the metal electrodes to initiate the plasma ionization process and to couple discharge energy into the plasma source. Once the plasma is ignited, ions will be accelerated to relatively high energy by the voltage applied on the metal electrodes. Energetic ions may cause sputtering damage to the hollow cathode or hallow anode electrodes. The booster chamber design disclosed in this invention greatly reduces the risk of ion sputter damage because there is no high voltage applied to the booster chamber. It not only improves the discharge efficiency, reduces the operation pressure, but also increases the reliability and lifetime of the plasma source.

Downstream plasma processing relies on the radicals generated inside the plasma source to diffuse into the downstream processing chamber to carry out etching or deposition processes. Usually the downstream processing chamber is much larger than the plasma chamber. Overall pumping speed of the downstream processing chamber could be more than 10 times higher than the pumping speed from the plasma source chamber because of the differential pumping aperture between the plasma source and the downstream sample chamber. As a result, the density of the radicals in the downstream sample chamber is significantly lower than the density of the radicals in the plasma source. If high speed etching and deposition is required in some applications, samples to be processed should be immersed in the plasma. Since there is no rf antenna inside the booster chamber, small samples can be placed inside the booster chamber without changing plasma discharge efficiency too much. Booster chamber can be designed into an assembly that can be easily detached from the main plasma source. Or it can be designed to have an entry port for user to load small samples. Even though there is no rf antenna or electrodes inside the booster chamber, the plasma density is similar to other part of the plasma source. Compared with downstream mode plasma processing, the etching and deposition speed inside the booster chamber can be increased by more than one order of magnitude. Even though booster chamber can only process relative small samples, it provides an alternative way to carry out high speed immersion mode plasma processing on a remote plasma source.

Traditionally the strength of the plasma is gauged by the ion and electron density derived from the I-V characteristics obtained in Langmuir probe measurement. To operate a Langmuir probe, high voltage power supply and complicated control electronics are required. The cost of implementing Langmuir probe into control electronics is usually quite high. Plasma emission spectrum has been widely used in plasma diagnostics. For example, researchers have developed methods to monitor the progress of the plasma etching process by measuring plasma emission intensity from certain reaction byproducts. Usually one or plural optical bandpass filters are used to select plasma emission from certain gas species. Composition of the gaseous species inside the plasma processing chamber will change at different stages of the plasma etching process. By measuring the light emission from specific gaseous species, users can monitor the change of the concentration level for such gaseous species inside the plasma processing chamber. This kind of plasma emission diagnostic has been widely used in traditional plasma processing equipment for end-point detection, such as U.S. Pat. No. 5,045,149. Plasma emission spectrum has also been used as a feedback mechanism for tuning rf matching in plasma reactors (U.S. Pat. No. 8,144,329). A laser welding method disclosed in U.S. Pat. No. US 2007/0289955 used the light emission strength of the plasma or plume to control the laser output in order to prevent occurrence of welding defects.

A method to gauge the strength of a remote plasma source by measuring the total plasma emission intensity or intensity within certain wavelength range has been disclosed in this invention. Unlike the end-point detection applications, the plasma emission intensity data in this method is not intended to monitor the change of the gas composition in the plasma source or in the processing chamber. Instead, it is used to gauge the strength of the remote plasma source. Usually, the gas composition in the remote plasma source doesn't change unless the gas delivery system changes the input gas composition. U.S. Pat. No. 2007/0289955 and U.S. Pat. No. 5,304,774 have disclosed methods to monitor light emission from plasma during laser welding to improve welding process. This is the first time the intensity of the plasma emission is used to gauge the strength of the plasma in remote plasma sources. Compared with the traditional Langmuir probe method, method disclosed in this invention is much easier to implement. Plasma emission intensity can be measured by photodiode, photoresistor or phototransistor. Most of these light sensors can be easily integrated into the control electronics at a very low cost.

DETAILED DESCRIPTION OF THE INVENTION

Embodiments are described by referring to specific illustrative examples. The examples are selected to facilitate a thorough understanding of the invention through illustrative design. Other configurations, implementations and arrangements embodying or practicing one or more of the appended claims can be made and used upon reading this description, by persons skilled in the relevant arts.

Figure 1:
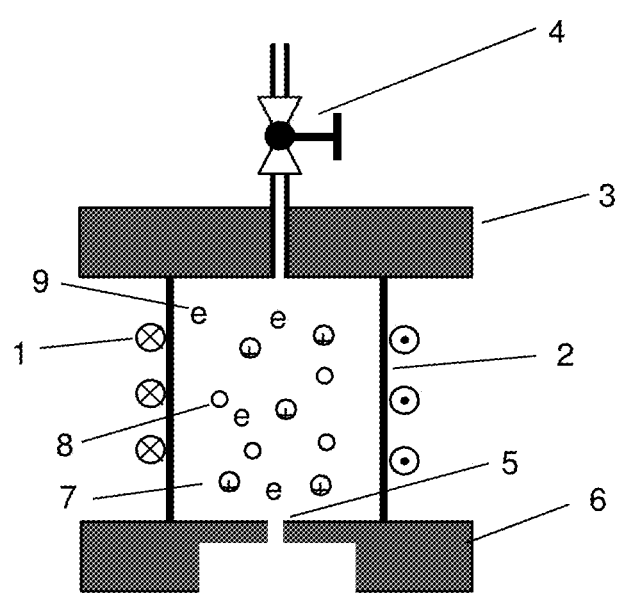
FIG. 1, an exemplary implementation of traditional inductively coupled plasma (ICP) source.

The present invention is an improvement over traditional remote plasma sources. The design of a typical cylindrical ICP source is shown in FIG. 1 (Review of Scientific Instruments, V74, page 2288). Metal coil 1 is wrapped around a nonconductive tube 2, which forms part of the plasma source wall. Tube 2 can be made of pyrex glass, quartz, sapphire, alumina or other type of ceramics. Cylindrical tube 2 may be enclosed by two end flanges 3 and 6. Gas input port can be machined into the back flange 3. A flow control device 4 can be used to control the process gas flow rate. Flange 3 and 6 can be made of insulating materials or conductive metals. Sometimes, the whole plasma chamber can be made of a carefully formed glass or quartz tube with two apertures on both ends, such as the shape of the ICP plasma source disclosed in U.S. Pat. No. 6,749,717. Aperture 5 can be used to create differential pumping between the plasma chamber (3, 2 and 6) and the downstream processing chamber. Even though the downstream processing chamber is not plotted in FIG. 1, it should be attached to the flange 6. Aperture 5 can also be used to define the initial shape of electron or ion beams. RF current flows through the induction coil 1 and generate ac electromagnetic field inside the plasma source chamber formed by 3, 6 and 2. High frequency ac electric field can ionize the process gas and initiate the plasma discharge process. There is no anode or cathode electrode inside the inductively coupled plasma source. Plasma usually consists of positively charged ions 7, negatively charged electrons 9 and neutral species 8. If ions 7 are extracted by a negative bias voltage applied on a downstream extraction electrode, plasma source is used as an ion source, such as the design explained in Review of Scientific Instruments, V74, page 2288. If electrons are extracted by a positive bias voltage applied on a downstream extraction electrode, plasma source is used as an electron source. If reactive neutral species diffused out of the plasma source are used to process downstream samples, plasma source is used as a downstream plasma cleaner, etcher or a deposition source.

Figure 2:
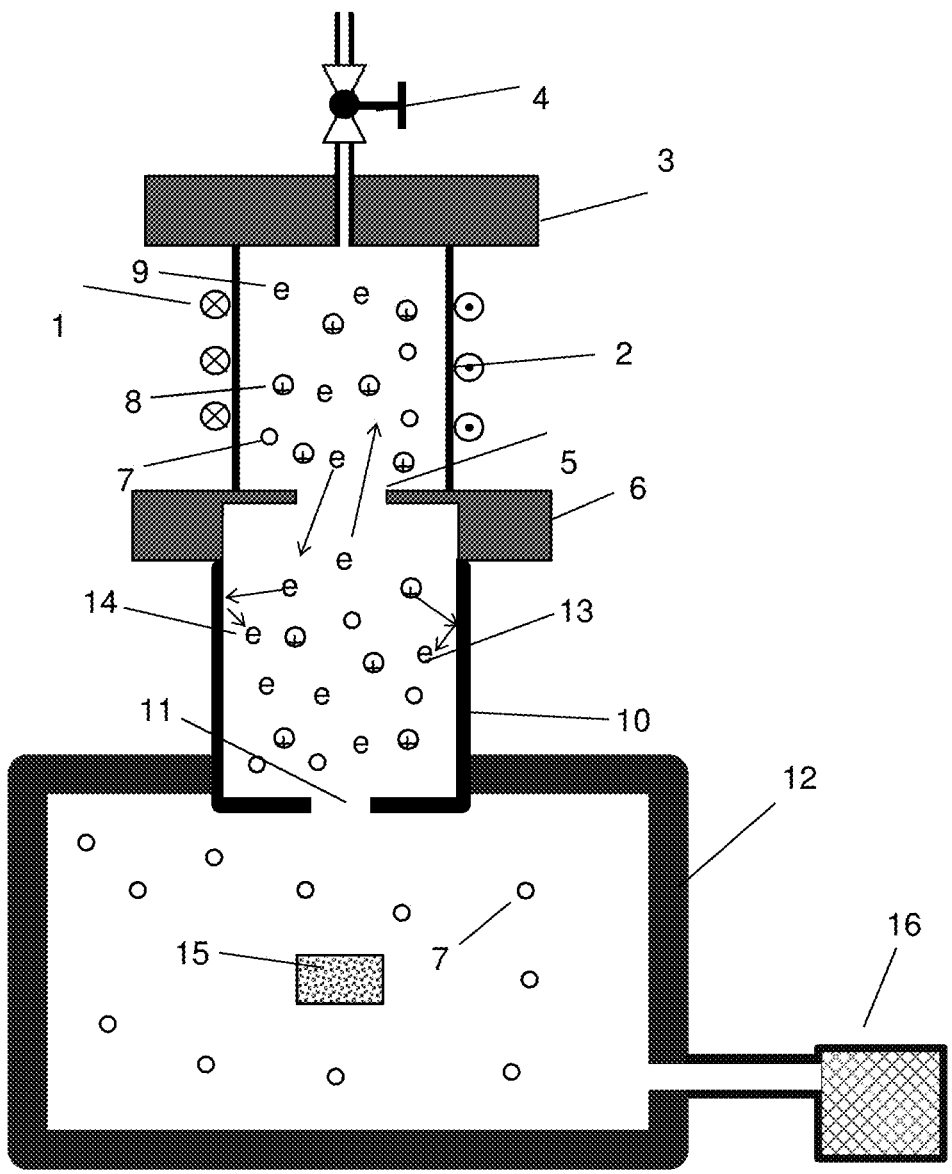
FIG. 2, an improved ICP plasma source with a booster tube between the main discharge chamber and the downstream processing chamber to amplify the plasma discharge process.

FIG. 2 is an example of an improved cylindrical ICP plasma source with a booster tube between a traditional ICP plasma source and the downstream processing chamber 12. Energetic electrons from the main plasma discharge chamber (2, 3 and 6) can diffuse into the booster chamber 10. Gas inside the booster chamber 10 can also be ionized by those energetic electrons. Plasma will be created inside the booster chamber 10 as well. Booster chamber 10 is usually made of metal with relatively high secondary electron yield. If energetic electrons or ions hit the metal tube wall, more secondary electrons 13 and 14 will be emitted into the plasma. Those additional secondary electrons can increase the overall electron density inside the booster tube. Electrons from the booster chamber 10 can also diffuse into the main discharge chamber (2, 3 and 6) and increase the electron density inside the main discharge chamber (2, 3 and 6). Increased electron density inside the main discharge chamber (2, 3 and 6) helps the plasma source to absorb more rf energy generated by the rf coil 1 and further improve the plasma density in the main discharge chamber (2, 3 and 6). Higher plasma density inside the main discharge chamber (2, 3 and 6) will increase the flow of the energetic electrons into the booster chamber 10. In summary, the booster chamber 10 in this embodiment functions as a positive feedback amplification device to the main discharge chamber (2, 3 and 6). Plasma discharge will eventually reach a stable state once the input rf energy and the energy lost to the wall and the energy transferred to the process gas reaches a balance.

For downstream mode plasma processing, sample 15 is usually placed inside a downstream vacuum chamber 12. Pumping system 16 generates relatively high vacuum level in the downstream vacuum chamber 12. Ions 8 and electrons 9 will soon recombine in the downstream vacuum chamber 12 if there is no electric field to separate them. Usually only neutral radical species 7 exist inside the downstream vacuum chamber 12 to carry out etching and deposition process on sample 15.

A cylinder ICP plasma source with solenoid coil is used as an example here to illustrate the principle of plasma discharge amplification process using the booster chamber. It's obvious, for people skilled in the art, that the solenoid coil can be replaced with a helicon type antenna to change the ICP plasma source into a helicon plasma source. If two curved metal plates are wrapped around the tube 2 and rf bias voltages are applied to the two metal plates, then the plasma source in the example will be changed to a capacitively coupled plasma source. If a booster chamber is attached to a plasma source with internal discharge electrodes, such as the plasma source design disclosed in U.S. Pat. No. 6,452,315, similar discharge amplification effect can also be achieved. Even though limited types of plasma discharge methods are provided as examples in this disclosure, it is obvious that the same concept can be applied to many kinds of plasma sources. It is also obvious that one or more than one booster chambers can be attached to the main discharge chamber.

Even though the booster chamber 10 can be made of ordinary metal such as aluminum, stainless steel, tantalum, or titanium, special materials that provide higher secondary electron yield, such as magnesium oxide, barium oxide, lanthanum hexaboride and thorium oxide, can also be used to fabricate the booster chamber 10. Those high secondary yield materials can be coated onto the ordinary metal chamber to cut cost. Even though limited types of materials are provided as examples here, other choices of materials that can provide high secondary electron yield can also be used to fabricate the booster chamber 10.

Figure 3:
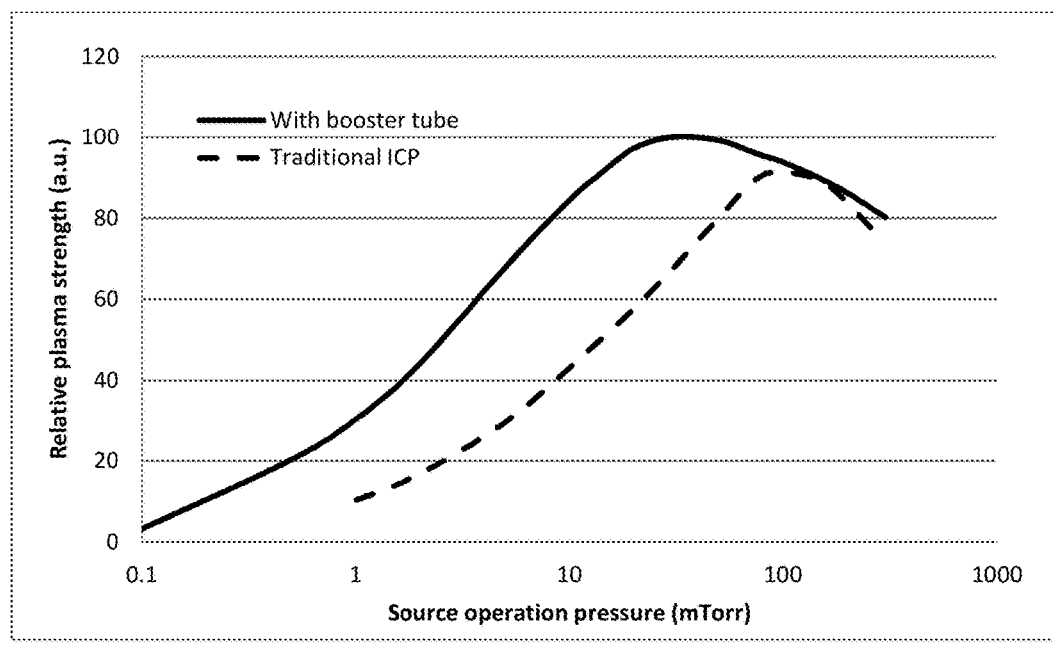
FIG. 3, Relative plasma strength at different source operation pressures for a traditional ICP plasma source (FIG. 1) and an improved ICP plasma source with a booster tube (FIG. 2) at 50 watt rf power.

FIG. 3 shows the relative plasma emission intensity comparison between the traditional ICP plasma source illustrated in FIG. 1 and the ICP plasma source equipped with a booster tube illustrated in FIG. 2. The booster tube used in this example has a length of 80 mm with an inner diameter of 28 mm. It's obvious that the booster tube significantly improved the plasma strength below 100 mTorr, especially for operation pressure below 30 mTorr. The plasma emission intensity is nearly doubled at 10 mtorr and tripled at 1 mTorr operation pressure. In addition, minimum operation pressure that can reliably ignite and sustain a plasma inside the plasma source has been extended to as low as 0.1 mTorr when air (N2+O2) is used as the process gas. Booster chamber also significantly increases total plasma volume. The chance that process gas molecules is dissociated by energetic electrons in the plasma can be further increased due to additional plasma interaction volume provided by the booster chamber. Even though a cylindrical booster tube with a diameter of 28 mm and a length of 80 mm is provided as an example here, it's obvious for persons skilled in the relevant arts to design booster chambers with different diameters or different lengths or in shapes other than cylindrical tubes, such as rectangular chambers or even in the form of spherical shapes upon reading this disclosure.

Figure 4:
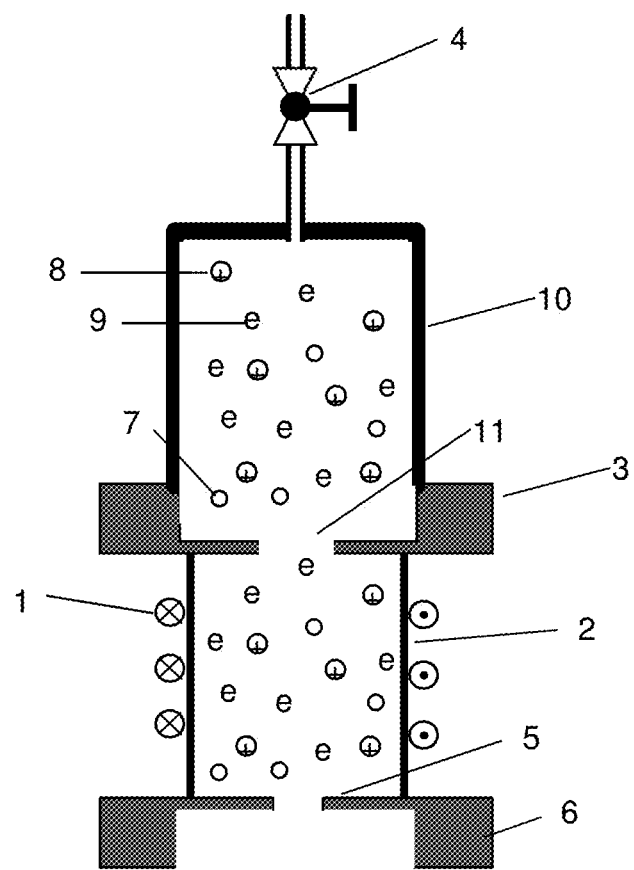
FIG. 4, another implementation of the booster tube. The booster tube has been connected to the upstream of the main discharge chamber.

In previous embodiment described in FIG. 2, the booster tube 10 is installed between the main discharge chamber (3, 2 and 6) and the downstream processing chamber 12. In yet another embodiment of the present invention, the booster chamber 10 is connected to upper stream of the main discharge chamber (3, 2 and 6) as shown in FIG. 4. Even though the downstream vacuum chamber 12 is not plotted in FIG. 4, it should be attached to flange 6 of the main discharge chamber. The mechanism of plasma amplification in this embodiment is the same as previous embodiment shown in FIG. 2. Of course, booster chamber 10 can be attached to any surface of the main discharge chamber if necessary.

Figure 5:
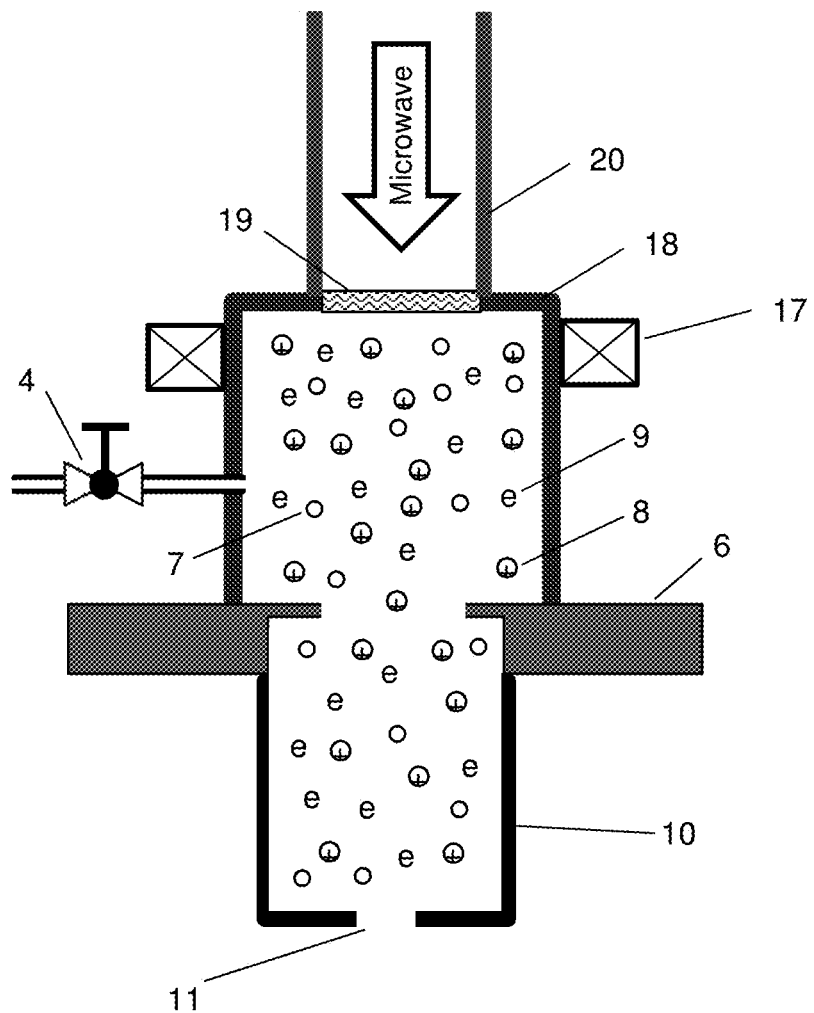
FIG. 5, microwave plasma source with a downstream booster tube.

In yet another embodiment of the present invention as illustrated in FIG. 5, a booster chamber 10 is attached to the downstream of a traditional microwave remote plasma source 18. Microwave energy travels through waveguide 20 and enters the main discharge chamber 18 through a glass or ceramic window 19. Permanent magnet 17 may be used to confine the energetic electrons. Once the plasma is generated in the main discharge chamber 18 by microwave energy, energetic electrons 9 can ignite and create high density plasma in booster chamber 10. Same plasma amplification process can improve the plasma density in the main discharge chamber 18. Of course, microwave energy can also be coupled into the main discharge chamber 18 from the side of the main plasma chamber 18.

Even though one booster chamber and one main discharge chamber design is used in the exemplary illustrations, it is obvious that more than one booster chambers can be attached to one or multiple main plasma discharge chambers and achieves plasma amplification effect.

Figure 6:
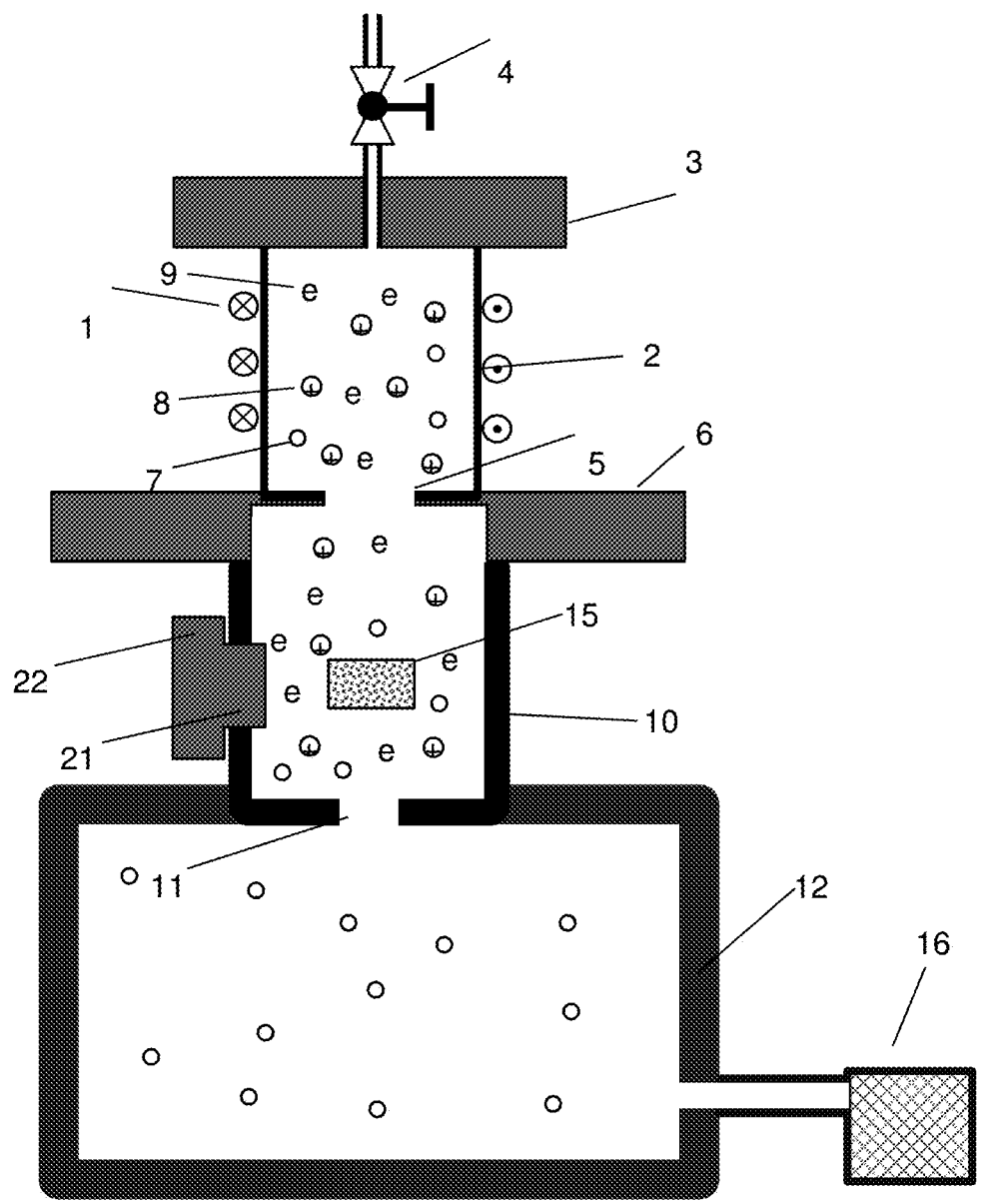
FIG. 6, high speed immersion mode plasma processing using booster chamber.

The etching and deposition rate in downstream mode plasma processing is usually lower than the etching and deposition rate when the sample is immersed in the plasma volume. For example, it may take more than half an hour to a clean heavily contaminated SEM samples in downstream mode plasma cleaning. But it may only take less than 1 minute to remove the contamination on the same sample if it is directly immersed in the plasma. FIG. 6 illustrates another application of the booster chamber 10 for high speed etching and deposition on small sample 15. High density plasma will fill all the volume in the booster chamber 10 once the plasma is ignited. If sample 15 is small enough, it can be directly placed inside the booster chamber 10 to achieve much higher etching or deposition speed than the etching or deposition speed when the sample is placed in the downstream as shown in FIG. 2. Booster chamber 10 can be designed in a way that it can be easily detached from the flange 6 so that sample 15 can be placed in the booster chamber 10. It is also possible to add a side entry port 21 so that sample 15 can be inserted into the booster chamber 10 through the side entry port 21. Side entry port 21 can be sealed by a door or a plug 22.

Figure 7:
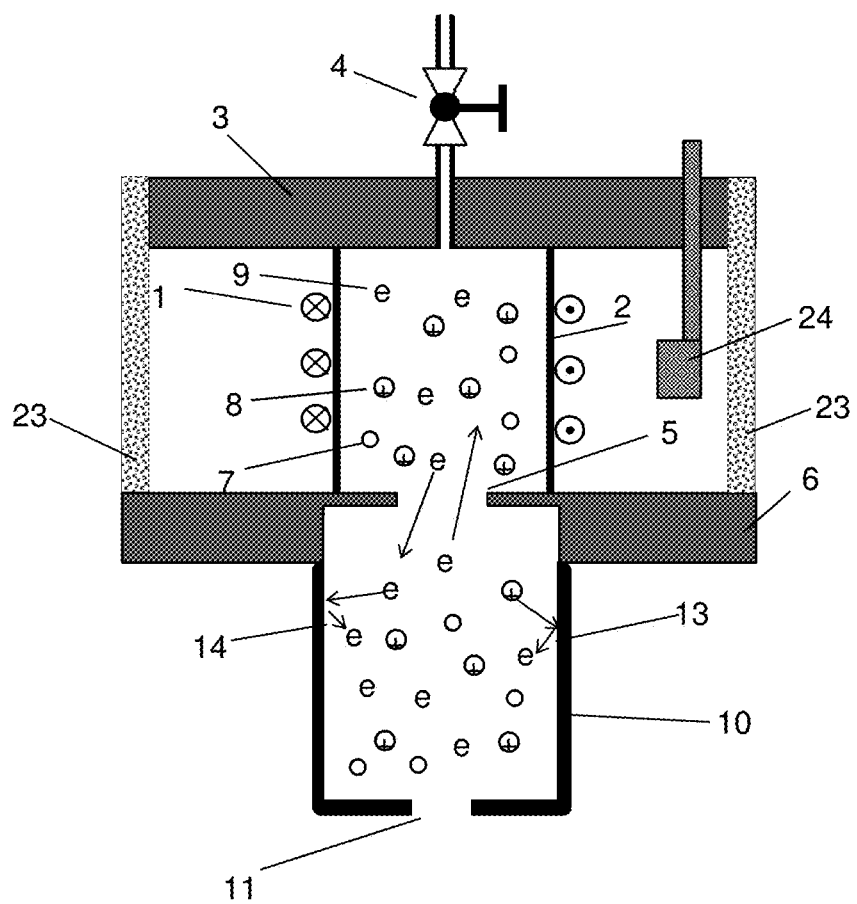
FIG. 7, exemplary implementation of measuring plasma strength by monitoring plasma emission intensity using a light sensor.

Plasma emission is an important aspect of plasma properties. Plasma may emit UV, visible and inferred light. To prevent operators from exposure of harmful UV light, plasma sources are usually enclosed by enclosure 23 shown in FIG. 7. Since operators may not have direct line of sight vision to the plasma source, it's hard for operators to know the status of the remote plasma source. The traditional way of measuring the strength of the plasma is to derive the ion and electron density by measuring I-V characteristics of the plasma using Langmuir probe. A new low cost method to measure the plasma strength in remote plasma source is explained in FIG. 7. The new method uses a light sensor module 24, such as photodiode, photoresistor or phototransistor, to measure total plasma emission or emission within a certain wavelength range to indicate the strength of the plasma. To measure the plasma emission within a certain wavelength range, a bandpass optical filter can be placed in front of the light sensor 24. Even though the light sensor is directly placed inside the enclosure of the remote plasma source in the example illustrated in FIG. 7, it is also possible to use an optical fiber to direct the plasma emission light out of the remote plasma source and measure it outside the plasma source enclosure. If the plasma source body is made of non-transparent materials, then an optically transparent window should be added to the plasma source chamber to direct the plasma light out of the plasma source.

Figure 8:
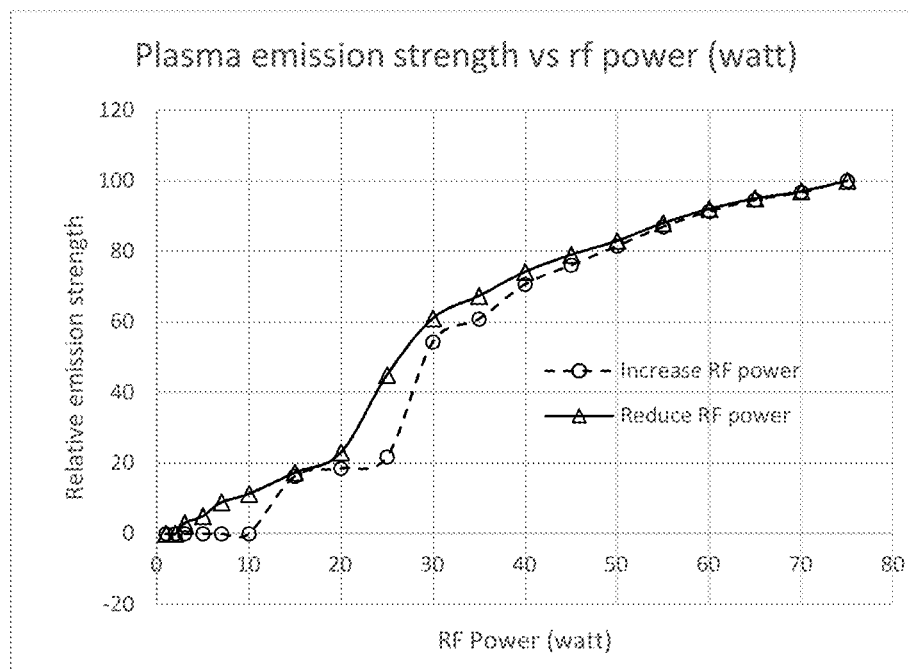
FIG. 8, plasma emission intensity vs rf power during rf power ramping-up and ramping-down phases.

Relative plasma emission strength vs rf power has been measured with an off-the-shelf low cost phototransistor. The data are shown in FIG. 8. The dashed line with circular markers shows the relative intensity of the total plasma emission when rf power is increased from 0 watt to 75 watt. Operators can easily observe the plasma ignition at 15 watt and a mode transition at 30 watt. After the mode transition, plasma emission intensity changes roughly linearly with the input rf power. The solid line with triangular markers shows the total plasma emission intensity when operator reduced rf power from 75 watt to 0 watt. Compared with rf ramping up curve, the mode transition point has shifted from 25 watt to 20 watt. Plasma could be sustained with only 3 watt rf power even though it took at least 15 watt rf power to ignite the plasma. Data in FIG. 8 proved the concept of low cost plasma strength sensor design for remote plasma sources.

What is claimed:

1. A plasma source comprising:
   a first vacuum chamber;
   a plasma discharge mechanism that produces primary plasma inside the first vacuum chamber; and
   a second vacuum chamber that includes an electron generation mechanism to produce secondary electrons in response to receiving energetic electrons diffused from the first vacuum chamber to the second vacuum chamber via an opening that connects the first vacuum chamber and the second vacuum chamber, wherein said energetic electrons and secondary electrons create secondary plasma inside the second vacuum chamber, and wherein part of the secondary electrons diffuses into the first vacuum chamber, enhances density of the primary plasma inside the first vacuum chamber.

2. The plasma source of claim 1, wherein the secondary electrons are produced through energetic ion or electron impingement on a wall of the second vacuum chamber.

3. The plasma source of claim 2, wherein the primary plasma and the secondary plasma positively amplify each other until energy received by the plasma source equals to energy loss by the plasma source.

4. The plasma source of claim 1, wherein the plasma discharge mechanism comprises one of an RF antenna wound around a ceramic tube or glass tube, an RF electrode, and a dielectric window and a waveguide that transport microwave energy into the first vacuum chamber.

5. The plasma source of claim 1, wherein the second vacuum chamber is made of a material having high secondary electron yield.

6. The plasma source of claim 1, wherein the second vacuum chamber is removably connected to the first vacuum chamber to allow a user to load a sample into the second vacuum chamber via a loading port of the second vacuum chamber.

7. The plasma source of claim 1 further comprising a third vacuum chamber directly connected to the first vacuum chamber via a second opening that allows electrons, ions, and neutral elements to exchange between the two chambers, wherein the third vacuum chamber also produces secondary electrons in response to receiving energetic electrons diffused from the first vacuum chamber to the third vacuum chamber.

8. The plasma source of claim 1 further comprising a third vacuum chamber directly connected to the second vacuum chamber via a second opening that allows electrons, ions, and neutral elements to exchange between the two chambers.

* * * * *